(12) United States Patent
Kubo

(10) Patent No.: US 11,437,993 B2
(45) Date of Patent: Sep. 6, 2022

(54) CAPACITIVE PROXIMITY SENSOR

(71) Applicant: Tokyo Parts Industrial Co., Ltd., Gunma-ken (JP)

(72) Inventor: Mamoru Kubo, Gunma-ken (JP)

(73) Assignee: Tokyo Parts Industrial Co., Ltd.

( * ) Notice: Subject to any disclaimer, the term of this patent is extended or adjusted under 35 U.S.C. 154(b) by 43 days.

(21) Appl. No.: 17/186,191

(22) Filed: Feb. 26, 2021

(65) Prior Publication Data

US 2021/0320656 A1 Oct. 14, 2021

(30) Foreign Application Priority Data

Apr. 10, 2020 (JP) .............................. JP2020-070704

(51) Int. Cl.
| | |
|---|---|
| *H03K 17/955* | (2006.01) |
| *H03K 17/95* | (2006.01) |
| *G01D 5/241* | (2006.01) |
| *H03K 17/96* | (2006.01) |

(52) U.S. Cl.
CPC ........... *H03K 17/955* (2013.01); *G01D 5/241* (2013.01); *H03K 17/9537* (2013.01); *H03K 2017/9606* (2013.01)

(58) Field of Classification Search
None
See application file for complete search history.

(56) References Cited

U.S. PATENT DOCUMENTS

2021/0194482 A1* 6/2021 Choi .................. H01F 27/2804

FOREIGN PATENT DOCUMENTS

JP 2019143988 A 8/2019

* cited by examiner

*Primary Examiner* — Daniel C Puentes
(74) *Attorney, Agent, or Firm* — Jordan and Koda, PLLC

(57) ABSTRACT

A capacitive proximity sensor of the present invention principally comprises a sensor electrode, a sensor circuit, a detection circuit, and a microcomputer. The sensor circuit has an LC parallel circuit and an LC series resonant circuit. Furthermore, the single sensor electrode is connected in parallel with the LC parallel circuit. By decreasing the drive voltage applied to the sensor electrode, the radiated noise generated by the sensor electrode is also decreased. In addition, foot detection sensitivity can be improved by amplifying the detection signal with the LC series resonant circuit.

6 Claims, 9 Drawing Sheets

CAPACITIVE PROXIMITY SENSOR

BACKGROUND OF THE INVENTION

The present invention relates to a capacitive proximity sensor, and in particular to a capacitive proximity sensor with which the sensitivity of human body detection, by way of a sensor circuit and a detection circuit, is improved, while decreasing the strength of the electric field radiated from a single sensor electrode.

The structure shown in FIG. 9 is known as a conventional capacitive proximity sensor 100. FIG. 9 is a circuit diagram schematically describing a conventional capacitive proximity sensor 100.

As shown in FIG. 9, the capacitive proximity sensor 100 principally comprises a sensor electrode 101, a sensor circuit 102, a detection circuit 103, and a microcomputer 104. The sensor circuit 102 is an LCR series resonant circuit. A sensor electrode 101 is connected in parallel with a capacitor C106, at a connection point 108 on the downstream side of a coil L105 of the sensor circuit 102 and the upstream side of the capacitor C106.

The detection circuit 103 principally comprises a diode D109 for half-wave rectification, a resistor R110 and a capacitor C111 constituting a low-pass filter, and an amplifier (buffer circuit) 112. Furthermore, the detection circuit 103 outputs, to the microcomputer 104, a determination voltage signal S100, corresponding to the capacitance of the sensor electrode 101, based on an electrical signal output from the sensor circuit 102. As shown in the figure, the detection circuit 103 is connected to the sensor circuit 102 at a connection point 113 on the downstream side of the capacitor C106 and the upstream side of the resistor R107, and the electrical signal is output to the detection circuit 103. Note that, the diode D109 is connected to the sensor circuit 102 at a connection point 114 between the capacitor C106 and the connection point 113, and rectifies the electrical signal.

The microcomputer 104 principally comprises an AD converter 115, a control unit 116, and a transmission means 117, and is operated upon receiving a control signal S104 from the vehicle. The AD converter 115 outputs, to the control unit 116, a determination signal S101, which results from A/D conversion of the determination voltage signal S100 that is output from the detection circuit 103. Furthermore, the control unit 116 determines, based on the determination signal S101, whether or not a user has come into proximity or contact with a predetermined surface of a door handle. When the control unit 116 determines that the aforementioned proximity or the like has occurred, the microcomputer 104 outputs a human detection signal S102 to a vehicle control unit (see, for example, Japanese Patent Laid-Open Publication No. 2019-143988).

As described above, in the capacitive proximity sensor 100, the transmission means 117 outputs a high-frequency signal S103 to the sensor circuit 102. A predetermined voltage is applied to the sensor electrode 101 based on the high-frequency signal S103, whereby a radiated electric field for detection is emitted from the sensor electrode 101. When the user approaches or contacts the predetermined surface of the door handle, a change in parasitic capacitance occurs in the area where the radiated electric field is generated, and the sensor circuit 102 generates an electric signal corresponding to the change in the parasitic capacitance.

With the capacitive proximity sensor 100, in order to improve the sensitivity of human body detection with the sensor electrode 101, it is necessary to increase the voltage applied to the sensor electrode 101 so as to increase the radiated electric field strength.

However, since the radiated electric field can also constitute a source of noise for a TV or audio equipment such as a radio, in the vehicle, and electronic equipment such as a mobile telephone belonging to the user, automobile manufacturers have established standard values for the radiated electric field strength. The strength of the radiated electric field from the sensor electrode 101 is consequently limited, making it difficult to improve human body detection sensitivity. In particular, compared to a structure in which two sensor electrodes are arranged facing each other, with a single sensor electrode 101, the radiated electric field emitted from the sensor electrode 101 cannot be absorbed, such that there are limitations on increasing the radiated electric field strength, making it difficult to improve the human body detection sensitivity.

SUMMARY OF THE INVENTION

One or more examples of the present invention provide a capacitive proximity sensor with which the sensitivity of human body detection, by way of a sensor circuit and a detection circuit, is improved, while decreasing the strength of the electric field radiated from a single sensor electrode.

Note that, in the aspects described below, the constituent elements employed can be used in the most freely chosen combinations possible. Furthermore, the aspects and technical features of the present invention are not limited to those described hereafter, and are to be understood based on the description in the entire specification and the drawings, or based on the inventive ideas that can be grasped by the a person skilled in the art, based on these descriptions.

A first aspect of the present invention relating to capacitive proximity sensor, comprises: a sensor electrode that detects the proximity of a human body; a transmission means for transmitting a high-frequency signal to the sensor electrode; a sensor circuit that outputs a detection result based on the capacitance change at the sensor electrode as a detection signal; a detection circuit that outputs the detection signal input from the sensor circuit as a determination voltage signal; and a control unit that determines the proximity of the human body to the sensor electrode based on the determination voltage signal input from the detection circuit, wherein: the sensor circuit has an LC parallel circuit in which a coil and a first capacitor are connected in parallel, and a second capacitor, the upstream side of which is connected in series with the coil to form an LC series resonant circuit, and the downstream side of which is connected to the downstream side of the first capacitor; the sensor electrode is connected to the upstream side of the LC parallel circuit and consists of a single electrode; and the detection circuit is connected to the downstream side of the coil and the upstream side of the second capacitor.

In a second aspect of the present invention relating to a capacitive proximity sensor, the detection circuit has a rectifier circuit in which a diode and a resistor are connected in parallel, and the frequency characteristics of the detection signal are adjusted with the resistor.

In a third aspect of the present invention relating to a capacitive proximity sensor, the capacitance of the first capacitor is adjusted to reduce the radiated noise from the sensor electrode within a desired range and to satisfy a detection sensitivity within a desired range at the sensor electrode.

In a fourth aspect of the present invention relating to a capacitive proximity sensor, the control unit has at least a detection frequency calibration step for the high-frequency signal; and, in the calibration step, the voltage of the determination voltage signal at the detection frequency when the human body is not in proximity of the sensor electrode is compared with a preset target voltage, and if the voltage of the determination voltage signal is beyond a predetermined range having the target voltage as the central value, a predetermined frequency width is added to or subtracted from the detection frequency, so that the voltage of said determination voltage signal is adjusted to be closer to the target voltage.

In a fifth aspect of the present invention relating to a capacitive proximity sensor, the control unit performs step control by alternately repeating the calibration step and the detection step for determining the proximity of the human body.

In the capacitive proximity sensor of the present invention, the sensor circuit has an LC parallel circuit and an LC series resonant circuit, the single sensor electrode is connected to the upstream side of the LC parallel circuit, and the detection circuit is connected to the point of connection of the coil L and the capacitor C in the LC series resonant circuit. With this circuit configuration the drive voltage applied to the sensor electrode by the LC parallel circuit is reduced, which reduces the radiated noise generated from the sensor electrode, while allowing for improvement in the human body detection sensitivity, by amplifying the detection signal by way of the LC series resonant circuit.

Furthermore, in the capacitive proximity sensor of the present invention, by adjusting the resistance value of the resistor in the rectifier circuit in the detection circuit, the sharpness of the resonant circuit of the sensor circuit can be adjusted to increase the signal change of the determination voltage signal at a frequency slightly higher than the resonance frequency. This circuit configuration can increase the voltage change in the determination voltage signal, between the case in which a human body is in proximity of the sensor electrode and the case in which a human body is not in proximity of the sensor electrode, thereby improving the human body detection sensitivity.

Further, in the capacitive proximity sensor of the present invention, if the capacitance of the first capacitor is increased, although the detection sensitivity is lowered, there is an advantage in that the radiated noise is reduced. By adjusting the capacitance of the first capacitor appropriately, the radiated noise can be decreased while ensuring the desired detection sensitivity.

Further, in the capacitive proximity sensor of the present invention, in the detection frequency calibration step, the detection frequency is suitably adjusted on the basis of the voltage of the determination voltage signal so that the voltage of the determination voltage signal at the detection frequency is brought closer to a preset target voltage. This calibration step can improve the human body detection accuracy by allowing detection determinations to be made using a region in the frequency characteristics in which there is a large voltage change.

Furthermore, even if the environment around the vehicle changes, the capacitive proximity sensor of the present invention can detect a human body using the most recent detection frequency, thereby preventing erroneous detection and missed detection.

DETAILED DESCRIPTION OF THE PREFERRED EMBODIMENTS

First Exemplary Mode of Embodiment

Hereafter, a capacitive proximity sensor 10 (hereafter, referred to as "proximity sensor 10") according to one mode of embodiment of the present invention will be described in detail based on the drawings. Note that, in the description of the present mode of embodiment, in principle, the same numbers will be used for the same parts, and redundant description will be omitted.

Figure 1A:
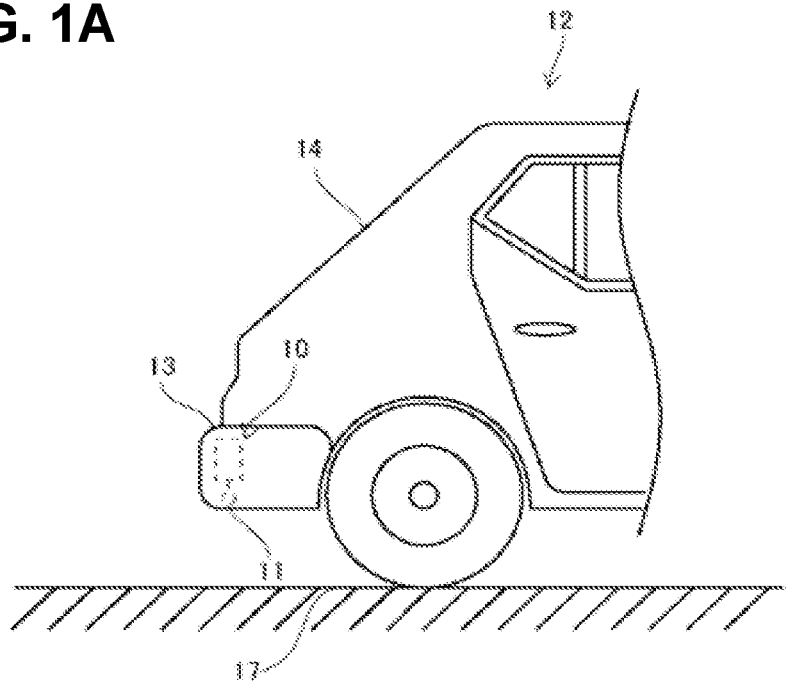
FIGS. 1A and 1B are side views serving to describe a capacitive proximity sensor in one mode of embodiment of the present invention.
Figure 1B:
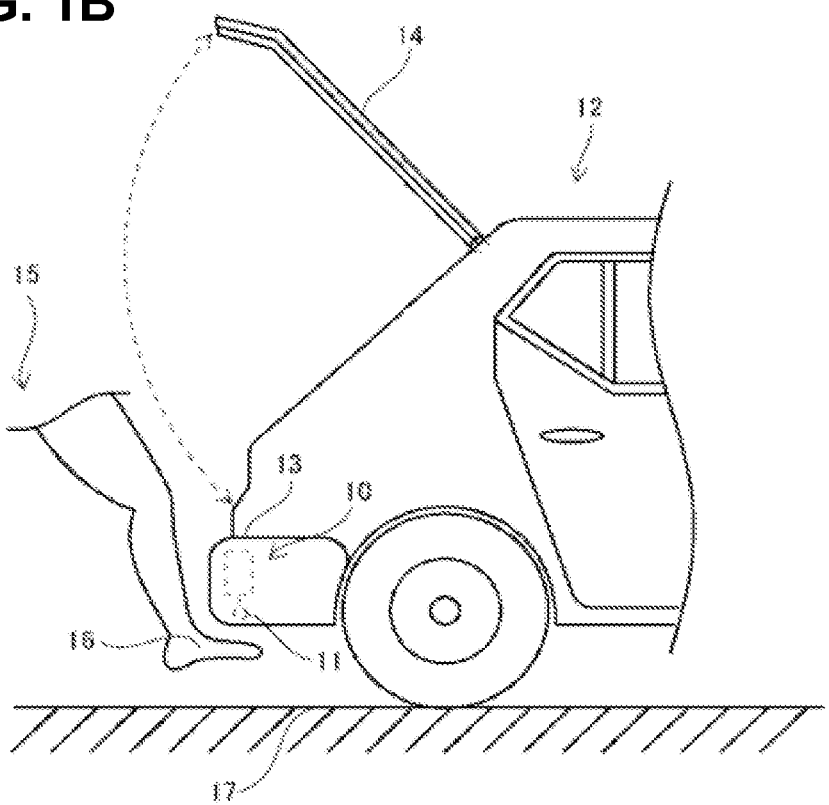
Figure 2:
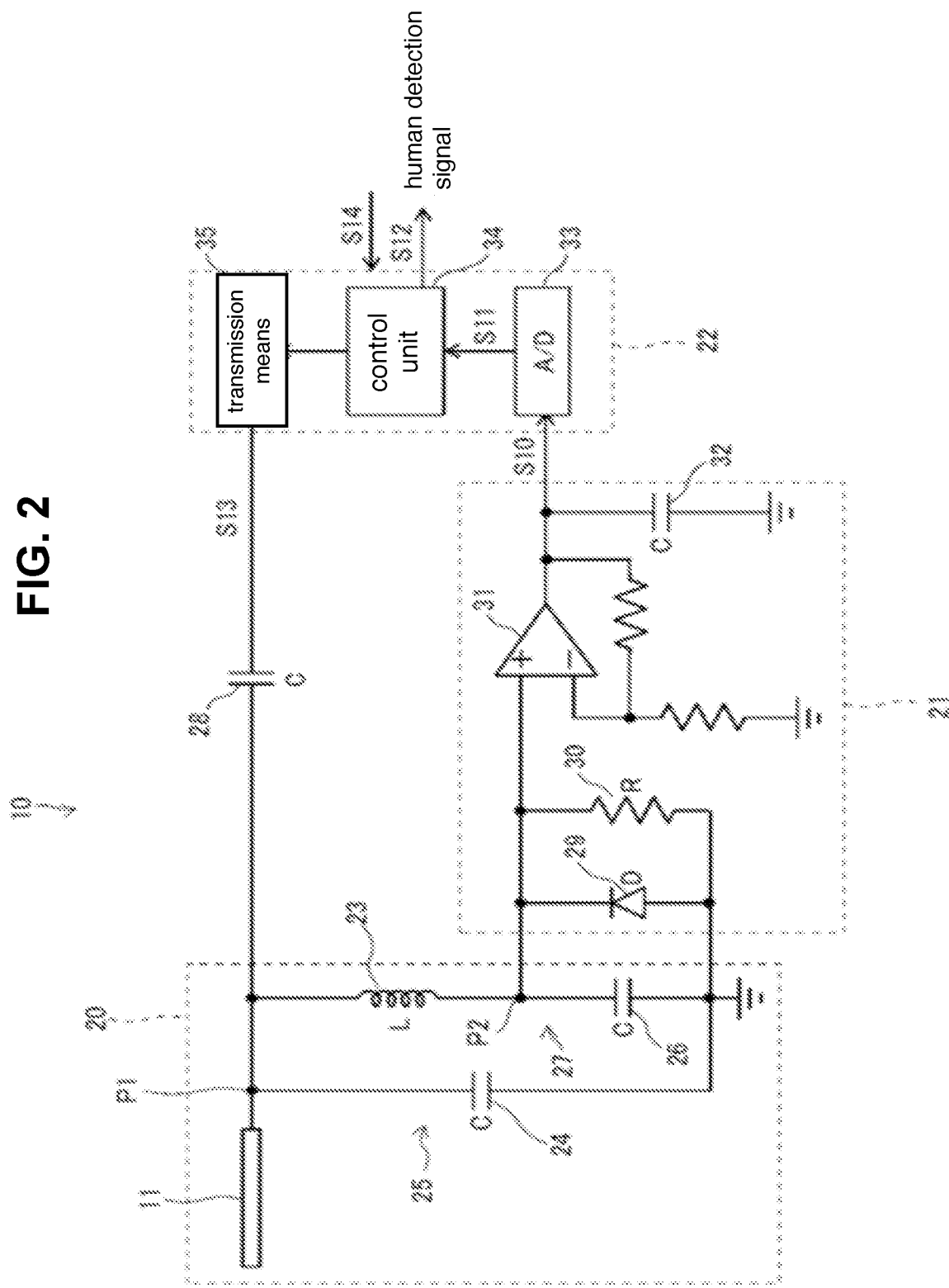
FIG. 2 is a circuit diagram describing a capacitive proximity sensor in one mode of embodiment of the present invention.

FIG. 1A is a side view describing the proximity sensor 10 of the present mode of embodiment. FIG. 1B is a side view describing the use of the proximity sensor 10 of the present mode of embodiment. FIG. 2 is a circuit diagram schematically describing the proximity sensor 10 of the present mode of embodiment.

As shown in FIG. 1A, the sensor electrode 11 of the proximity sensor 10 comprises a single electrode and is arranged inside a rear bumper 13 of a vehicle 12. The proximity sensor 10 is used as a sensor for unlocking and locking a back door 14 in a keyless entry system. As shown FIG. 1B, when a user 15 carrying an electronic key (not shown) performs an operation of inserting a foot 16 under the rear bumper 13, the proximity sensor 10 detects the foot 16 by way of the sensor electrode 11. A door control unit (not shown) of the vehicle 12 then automatically controls an opening/closing operation of the back door 14 as a result of the detection signal S12 (see FIG. 2), for the foot 16 of the user 15, being input from the proximity sensor 10.

Note that the location at which the proximity sensor 10 is installed is not limited to the rear bumper 13 of the vehicle 12, and it may be installed, for example, inside a step (not shown) for getting in and out at the side of the vehicle 12, and the door control unit (not shown) of the vehicle 12 may automatically control the opening/closing operation of a sliding door (not shown) of the vehicle 12. Furthermore, that which is detected by the proximity sensor 10 is not limited to the foot 16 of the user 15, but rather the proximity sensor 10 can also detect other parts of the user 15, such a hand or arm.

As shown in FIG. 1A, the sensor electrode 11 is installed in a straight line following the width direction of the vehicle 12 in the rear bumper 13 and, for example, the cross-sectional area is 2 mm² and the length is 60 cm. There are no particular limitations on the material for the sensor electrode 11, and an insulated wire, a coaxial cable, a conductive metal plate such as a copper plate, and the like can be used. Note that, when using an insulated wire or a coaxial cable, the electrode area can be easily increased by bending the cable so that it makes one or more round trips, so as to improve the detection sensitivity for the foot 16 of the user 15.

As shown in FIG. 2, the proximity sensor 10 principally comprises a sensor electrode 11, a sensor circuit 20, a detection circuit 21, and a microcomputer 22.

The sensor circuit 20 has: an LC parallel circuit 25 in which a coil L23 and a first capacitor C24 are connected in parallel; and an LC series resonant circuit 27 in which the coil L23 and a second capacitor C26 are connected in series. With this circuit configuration, the sensor circuit 20 is used as a parallel-series resonant circuit. Note that, in the present mode of embodiment, the inductance of the coil L23 is designed as, for example, 3 mH, the capacitance of the first capacitor C24 is designed as, for example, 47 pF, and the capacitance of the second capacitor C26 is designed as, for example, 15 pF.

As shown in the drawing, a third capacitor C28 is connected between the sensor circuit 20 and the transmission means 35 of the microcomputer 22. Furthermore, the third capacitor C28 is used as an impedance conversion element, isolating the sensor circuit 20 from the low output impedance of the microcomputer 22. Note that, in the present mode of embodiment, the capacitance of the third capacitor C28 is designed as, for example, 7 pF.

Furthermore, the sensor electrode 11 is connected to the upstream side of the coil L23 and the first capacitor C24, at a connection point P1. That is to say, the sensor electrode 11 is connected in parallel with the LC parallel circuit 25 in the sensor circuit 20.

As shown in FIG. 1B, the sensor electrode 11 is located at a height of approximately 15 cm to 25 cm from the ground 17. When the foot 16 of the user 15 is inserted between the sensor electrode 11 and the ground 17, a parasitic capacitance is generated between the sensor electrode 11 and the foot 16 and between the foot 16 and the ground 17. Since the proximity sensor 10 determines the foot 16 of the user 15 by detecting the change in the parasitic capacitance, the capacitance of the first capacitor C24 in the LC parallel circuit 25 is designed taking into account the summation of the parasitic capacitance at the sensor electrode 11.

Here, the first capacitor C24 has the effect of adjusting the strength of the radiated electric field from the sensor electrode 11. As the capacitance of the first capacitor C24 increases, the current flowing through the first capacitor C24 increases, which correspondingly decreases the strength of the radiated electric field from the sensor electrode 11, resulting in a reduction in radiated noise and a decrease in detection sensitivity. Conversely, as the capacitance of the first capacitor C24 decreases, the strength of the radiated electric field from the sensor electrode 11 increases, resulting in an increase in radiated noise and an increase in detection sensitivity.

The capacitance of the first capacitor C24 can be designed freely, including 0, considering the increase in detection sensitivity at the sensor electrode 11 and the decrease in radiated noise. In the present mode of embodiment, priority is given to the reduction of radiated noise and, as such, the capacitance of the first capacitor C24 is designed to be large relative to the parasitic capacitance. Specifically, the capacitance of the first capacitor C24 is designed as 47 pF and the parasitic capacitance at the sensor electrode 11 is designed as 10 pF to 20 pF.

With this circuit configuration, the pulse voltage of the high-frequency signal S13 input from the transmission means 35 of the microcomputer 22 is decreased by the LC parallel circuit 25. In the present mode of embodiment, the pulse voltage of the high-frequency signal S13 is 3.3 V, but a drive voltage of only 0.2 V to 0.3 V is applied to the sensor electrode 11.

As a result, the voltage applied to the sensor electrode 11 is greatly decreased, and the radiated electric field strength from the sensor electrode 11 is also greatly decreased. By decreasing the radiated noise from the sensor electrode 11, the source of noise for a TV or audio equipment such as a radio in the vehicle 12, and electronic equipment such as a mobile telephone belonging to the user 15 is also decreased, and the standard values for radiated electric field strength of automobile manufacturers can be fully satisfied. Furthermore, the sensor electrode 11 is implemented as a single electrode structure, and thus cost reductions are achieved, as compared with a facing two-sensor electrode structure.

The detection circuit 21 principally comprises a diode D29 for half-wave rectification, a resistor R30 for adjusting the frequency characteristics of the detection signal, an amplifier (buffer circuit) 31, and a fourth capacitor C32 for smoothing the determination voltage signal S10 from the amplifier 31. As shown in the figure, the detection circuit 21 is connected to the LC series resonant circuit 27 at a connection point P2, on the downstream side of the coil L23 and the upstream side of the second capacitor C26. Furthermore, the detection circuit 21 outputs, to the microcomputer 22, a determination voltage signal S10 corresponding to the change in capacitance at the sensor electrode 11, based on the detection signal output from the sensor circuit 20. Note that, in the present mode of embodiment, the capacitance of the fourth capacitor C32 is designed to be, for example, 0.1 pF.

As described above, by decreasing the voltage applied to the sensor electrode 11 and decreasing the strength of the electric field radiated from the sensor electrode 11, the detection sensitivity at the sensor electrode 11 is also lowered. However, with the circuit configuration described above, the detection signal from the sensor circuit 20 is amplified by the LC series resonant circuit 27 before being output. With the present mode of embodiment, a detection signal voltage of approximately 1.0 V can be obtained. As a result, the detection sensitivity of the proximity sensor 10 is improved by amplifying the detection signal from the sensor circuit 20 while decreasing the noise radiated by the sensor electrode 11.

Furthermore, in the detection circuit 21, a resistor R30 is connected between the LC series resonant circuit 27 and the amplifier 31, and in parallel with the diode D29. As will be described in detail hereafter, by adjusting the resistance value of the resistor R30 so as to adjust the sharpness of resonance of the resonant circuit in the sensor circuit 20, there is a greater change in the detection signal and the determination voltage signal S10, in the signal at frequencies slightly higher than the resonance frequency $f_{res}$ (see FIG. 5) when the foot 16 of the user 15 is not in proximity of the sensor electrode 11 and the resonance frequency $f_{hum}$ (see FIG. 5) when the foot 16 of the user 15 is in proximity of the sensor electrode 11, such that the detection accuracy of the proximity sensor 10 is improved.

Note that, the determination voltage signal S10 output from the amplifier 31 is smoothed by a fourth capacitor C32, and is output from the detection circuit 21 to the microcomputer 22 as a DC determination voltage signal S10.

The microcomputer 22 principally comprises an AD converter 33, a control unit 34, and a transmission means 35, and is operated upon receiving a control signal S14 from the vehicle 12. Furthermore, the AD converter 33 outputs, to the control unit 34, a proximity determination signal S11, which results from performing A/D conversion on the determination voltage signal S10 input from the detection circuit 21.

Based on the proximity determination signal S11, the control unit 34 determines whether or not the foot 16 (see FIG. 1B) of the user 15 (see FIG. 1B) has come into proximity of the sensor electrode 11. If the control unit 34 determines that the foot 16 has come into proximity, the microcomputer 22 outputs, to a door control unit (not shown) of the vehicle 12, a human detection signal S12 to the effect that the foot 16 has been detected. Furthermore, as will be described in detail below, the control unit 34 performs step control in which a detection frequency calibration step and a detection step are alternately performed.

The transmission means 35 outputs a high-frequency signal S13 of a predetermined frequency and duty ratio to the sensor circuit 20 at a desired timing under control by the control unit 34. Note that, in the present mode of embodiment, a rectangular high-frequency signal is used as the high-frequency signal S13, but the frequency of the high-frequency signal S13 is not particularly limited. Furthermore, if the sensor electrode 11 is installed in the rear bumper 13 (see FIG. 1A) so as to detect the foot 16 of the user 15, as in the present mode of embodiment, a high-frequency signal S13 of 200 kHz to 1000 kHz is preferred, in consideration of the detection area and detection sensitivity. Furthermore, the high-frequency signal S13 is not limited to a rectangular wave, but rather can also be a sine wave or a triangular wave.

Figure 3:
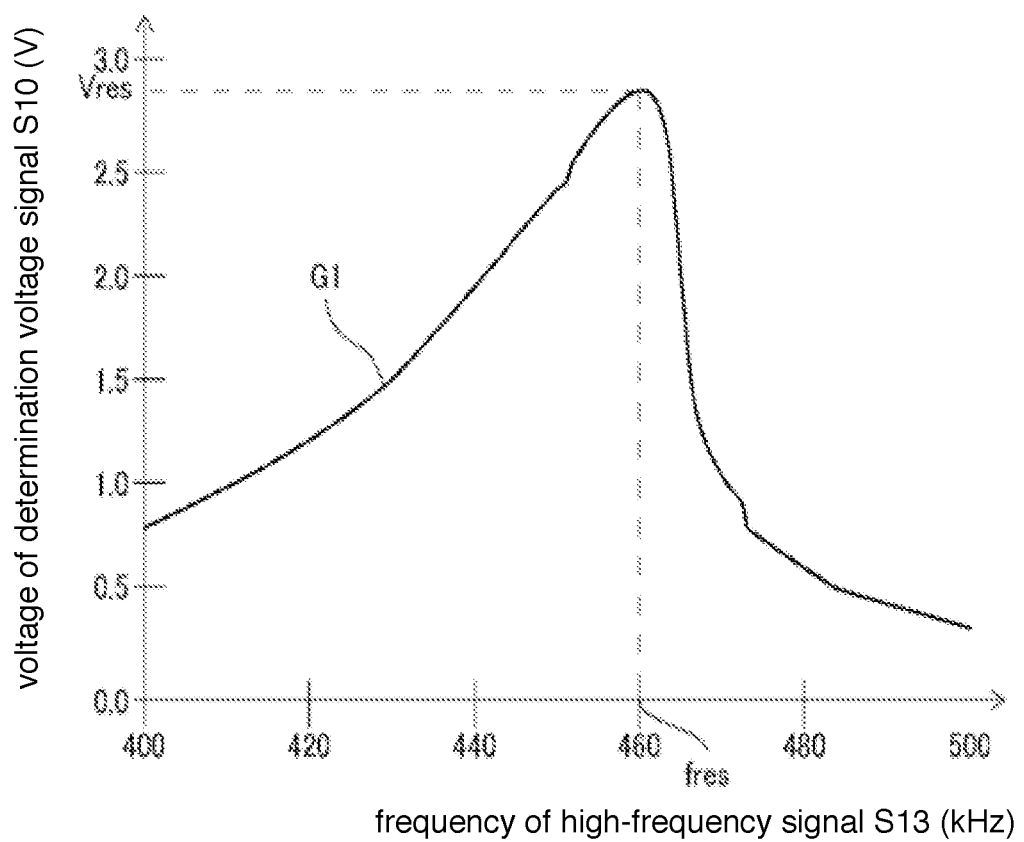
FIG. 3 is a characteristic graph describing frequency characteristics in a capacitive proximity sensor in one mode of embodiment of the present invention.
Figure 4A:
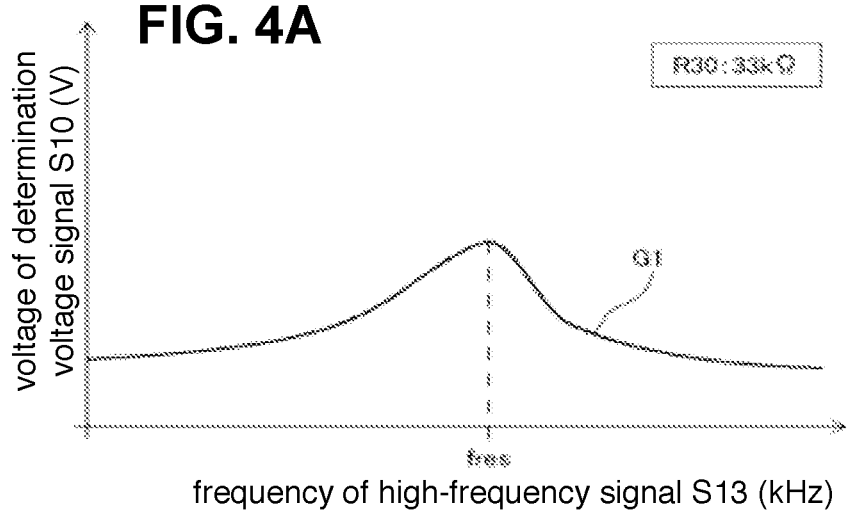
FIGS. 4A, 4B, and 4C are characteristic graphs describing frequency characteristics in a capacitive proximity sensor in one mode of embodiment of the present invention.
Figure 4B:
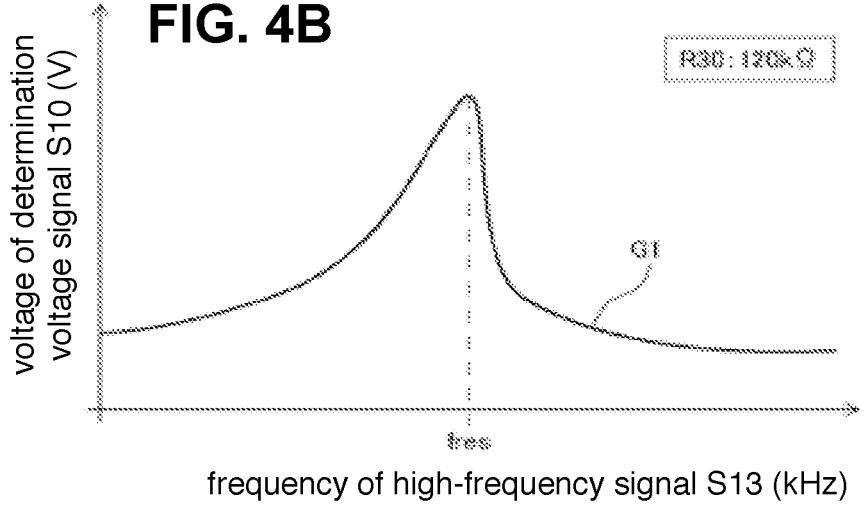
Figure 4C:
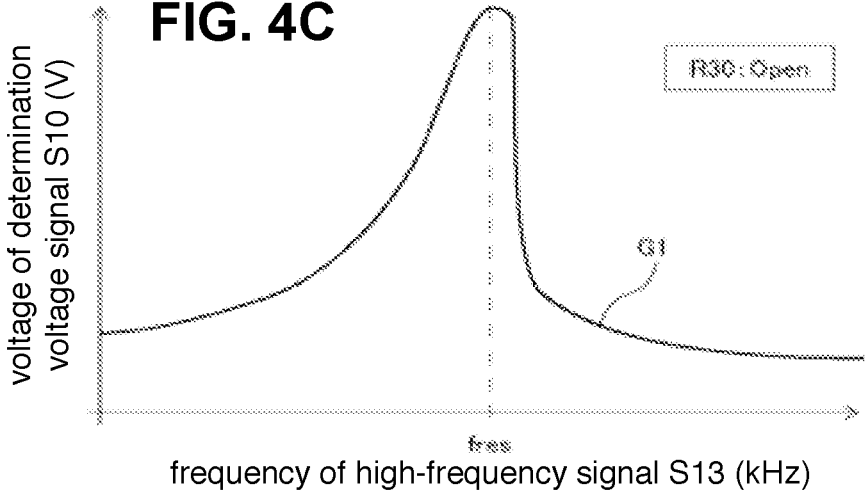
Figure 5:
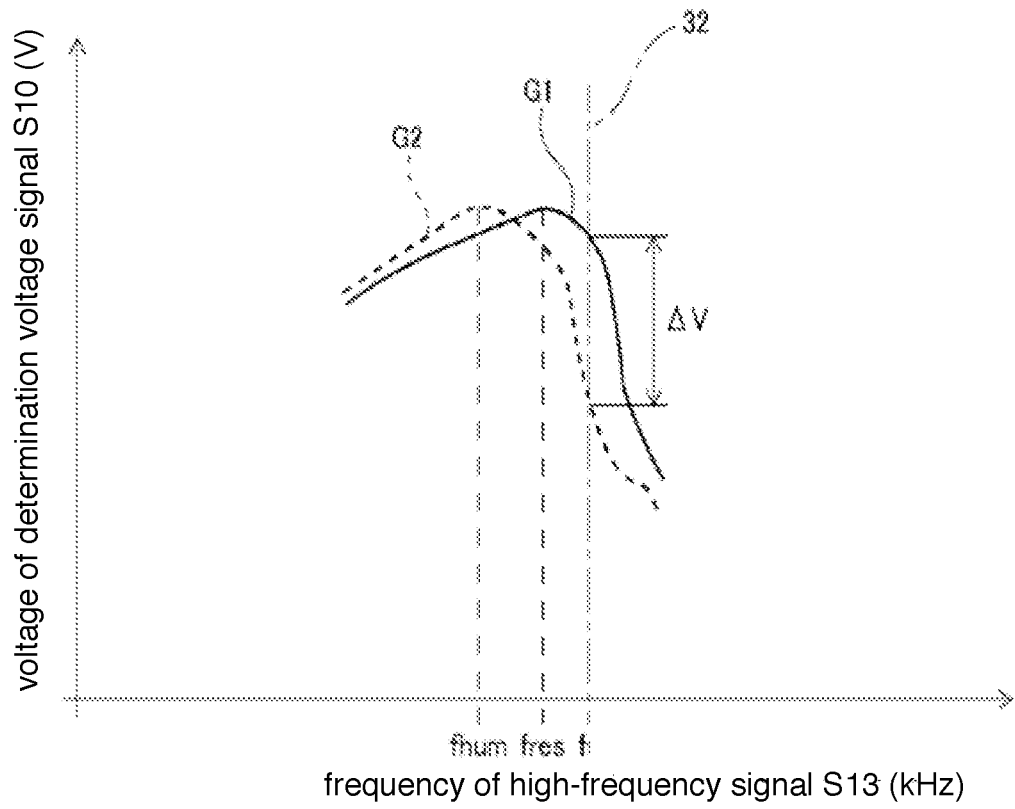
FIG. 5 is a characteristic graph describing a detection method in a capacitive proximity sensor in one mode of embodiment of the present invention.

FIG. 3 is a characteristic graph describing frequency characteristics in the proximity sensor 10 in the present mode of embodiment. FIG. 4A, FIG. 4B, and FIG. 4C are characteristic graphs relating to frequency characteristics in the proximity sensor 10 of the present mode of embodiment, describing the frequency characteristics when the resistance value of the resistor R30 in the detection circuit 21 is varied. FIG. 5 is a characteristic graph describing the frequency characteristics when the foot 16 of the user 15 comes into the proximity of the sensor electrode 11, and the frequency characteristics when it is not in proximity, in the proximity sensor 10 in the present mode of embodiment. Note that, in describing FIG. 3 to FIG. 5, FIG. 1A, FIG. 1B, and FIG. 2 will be referred to as appropriate.

FIG. 3 shows the relationship between the high-frequency signal S13 input to the sensor circuit 20 and the determination voltage signal S10 under a constant ambient environment. In FIG. 3, the horizontal axis shows the frequency f (kHz) of the high-frequency signal S13 input from the transmission means 35 of the microcomputer 22 to the sensor circuit 20, and the vertical axis shows the voltage (V) of the determination voltage signal S10 output from the detection circuit 21. Note that, in FIG. 3, a characteristic curve G1 shows the frequency characteristics when the foot 16 of the user 15 is not in proximity of the sensor electrode 11. Furthermore, FIG. 3 shows a portion of a characteristic curve obtained by performing a frequency sweep of the high-frequency signal S13 from 200 kHz to 600 kHz at a specified sweep speed.

As shown in FIG. 3, the resonance frequency $f_{res}$ of the high-frequency signal S13 is approximately 460 kHz, and the voltage $V_{res}$ at that resonance is approximately 2.9 V. Furthermore, a steep change in voltage, which is a large signal change, occurs at frequencies slightly higher than the resonance frequency $f_{res}$. Furthermore, the high-frequency signal S13 shown in FIG. 3 shows a left-right asymmetrical waveform with the resonance frequency $f_{res}$ at the center. On the basis of the waveform of this characteristic curve G1 and the fact that the sensor circuit 20 is configured as a parallel-series resonant circuit, as described above, it is presumed that the resonance frequency $f_{res}$ for the sensor circuit 20 is the series resonance point and that this will have a parallel resonance point in a higher frequency region than the series resonance point.

As will be described in detail hereafter, by using the large signal change at the frequency slightly higher than the resonance frequency $f_{res}$ of the high-frequency signal S13, a large voltage change $\Delta V$ (see FIG. 5) can be generated in the detection circuit 21 with a small change in the parasitic capacitance at the sensor electrode 11. As a result, the proximity sensor 10 can accurately determine the foot 16 of the user 15 while decreasing radiated noise.

FIG. 4A, FIG. 4B, and FIG. 4C show the relationship between the high-frequency signal S13 input to the sensor circuit 20 and the determination voltage signal S10, when the resistance value of the resistor R30 is changed. Note that FIG. 4A, FIG. 4B, and FIG. 4C show the characteristic curves G1 when the foot 16 of the user 15 is not in proximity of the sensor electrode 11, in the same manner as in FIG. 3, wherein the horizontal axis shows the frequency f (kHz) of the high-frequency signal S13 input from the transmission means 35 of the microcomputer 22 to the sensor circuit 20, and the vertical axis shows the voltage (V) of the determination voltage signal S10 output from the detection circuit 21.

By providing the resistor R30 in the detection circuit 21, the sharpness of the resonance of the resonant circuit of the sensor circuit 20 is decreased. In FIG. 4A, the resistance value of the resistor R30 is 33 kΩ, and when the resistance value of resistor R30 is set low, the sharpness of the resonance is also decreased, such that the waveform of characteristic curve G1 in the frequency region slightly higher than the resonance frequency $f_{res}$ will constitute a gentle signal change.

Meanwhile, in FIG. 4B, the resistance value of resistor R30 is 120 kΩ, and when the resistance value of resistor R30 is set appropriately, the sharpness of the resonance increases such that, as described above using FIG. 3, the waveform of the characteristic curve G1 at a frequency slightly higher than the resonance frequency $f_{res}$ constitutes a large signal change. Note that FIG. 4C shows the case in which resistor R30 is not provided and an open circuit is used (the resistance R30 is considered to be infinite), in which the waveform of the characteristic curve G1 at frequencies slightly higher than the resonance frequency $f_{res}$ will be an excessively steep signal change, making it extremely difficult to match the detection frequency $f_1$ (see FIG. 5) described below to the location at which the signal change is large. In the present mode of embodiment, by setting the resistance value of the resistor R30 to 120 kΩ, a large voltage change $\Delta V$ of approximately 2.9 V to approximately 0.8 V is obtained in between resonance frequency $f_{res}$ of 460 kH and 470 kHz.

FIG. 5 shows the relationship between the high-frequency signal S13 input to the sensor circuit 20 and the determination voltage signal S10. The solid line shows the characteristic curve G1 when the foot 16 of the user 15 is not in proximity of the sensor electrode 11, and the dotted line shows the characteristic curve G2 when the foot 16 of the user 15 is in proximity of the sensor electrode 11. Note that the horizontal axis shows the frequency f (kHz) of the high-frequency signal S13 input from the transmission means 35 of the microcomputer 22 to the sensor circuit 20, and the vertical axis shows the voltage (V) of the determination voltage signal S10 output from the detection circuit 21.

As shown in FIG. 5, when the foot 16 of the user 15 is in proximity of the sensor electrode 11, the parasitic capacitance at the sensor electrode 11 increases, such that the resonance frequency $f_{hum}$ when the foot 16 of the user 15 is in proximity of the sensor electrode 11 will be slightly lower than the resonance frequency $f_{res}$ when the foot 16 of the user 15 is not in proximity of the sensor electrode 11. Furthermore, the dotted-dashed line 32 shows the detection frequency $f_1$ input from the transmission means 35 of the microcomputer 22 to the sensor circuit 20. At the detection frequency $f_1$, a large voltage change $\Delta V$ is generated between the voltage value when the foot 16 of the user 15 is in proximity of the sensor electrode 11 and the voltage value when the foot 16 of the user 15 is not in proximity of the sensor electrode 11.

As described above, in the present mode of embodiment, the detection accuracy of the proximity sensor 10 is improved by using a region in which a large signal change occurs at a frequency slightly higher than each of the resonance frequency $f_{res}$ and resonance frequency $f_{hum}$ in the sensor circuit 20.

In the present mode of embodiment, as described above using FIG. 4A, FIG. 4B, and FIG. 4C, if the resistance value of the resistor R30 is set low, the waveform of the characteristic curve G1 will be gentle and the aforementioned voltage change $\Delta V$ at the detection frequency $f_1$ will be small, such that the detection accuracy will be inferior. Furthermore, if the resistor R30 of the detection circuit 21 is set high, the waveform of the characteristic curve G1 will be excessively steep, which makes the setting of the detection frequency $f_1$ itself difficult. Meanwhile, by setting the resistance value of the resistor R30 in the detection circuit 21 to an appropriate magnitude, a large signal change is generated in the waveform of the characteristic curve G1, and the voltage change $\Delta V$ at the detection frequency $f_1$ will be large, thereby improving the detection accuracy.

That is to say, the detection accuracy in the proximity sensor 10 can be improved by setting the frequency at which aforementioned large voltage change $\Delta V$ occurs as the detection frequency $f_1$ and determining whether or not the foot 16 of the user 15 is in the proximity of the sensor electrode 11, according to whether or not the voltage change $\Delta V$ based on the determination voltage signal S10 is equal to or greater than a threshold value.

Figure 6:
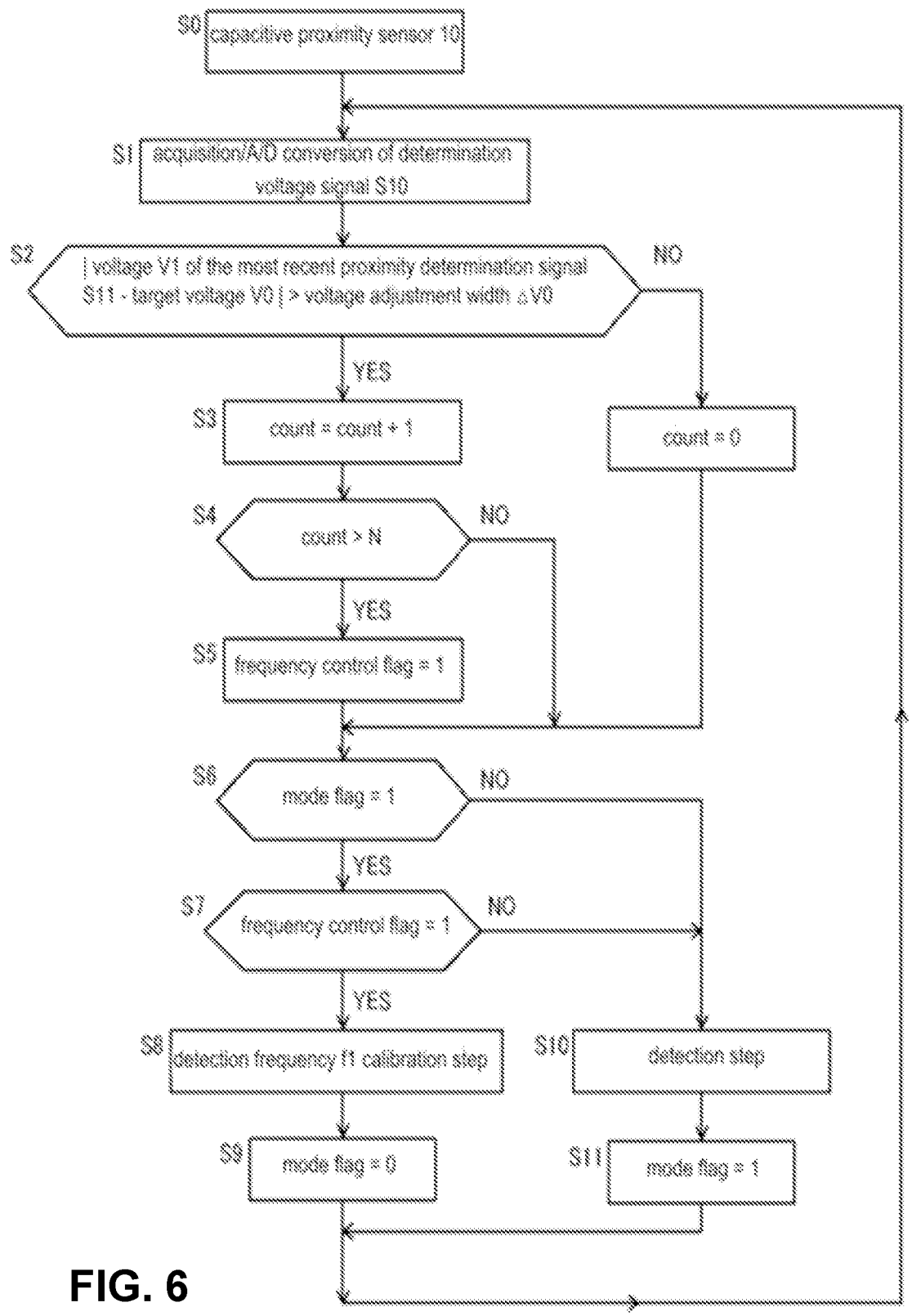
FIG. 6 is a flowchart describing step control in a capacitive proximity sensor in one mode of embodiment of the present invention.
Figure 7:
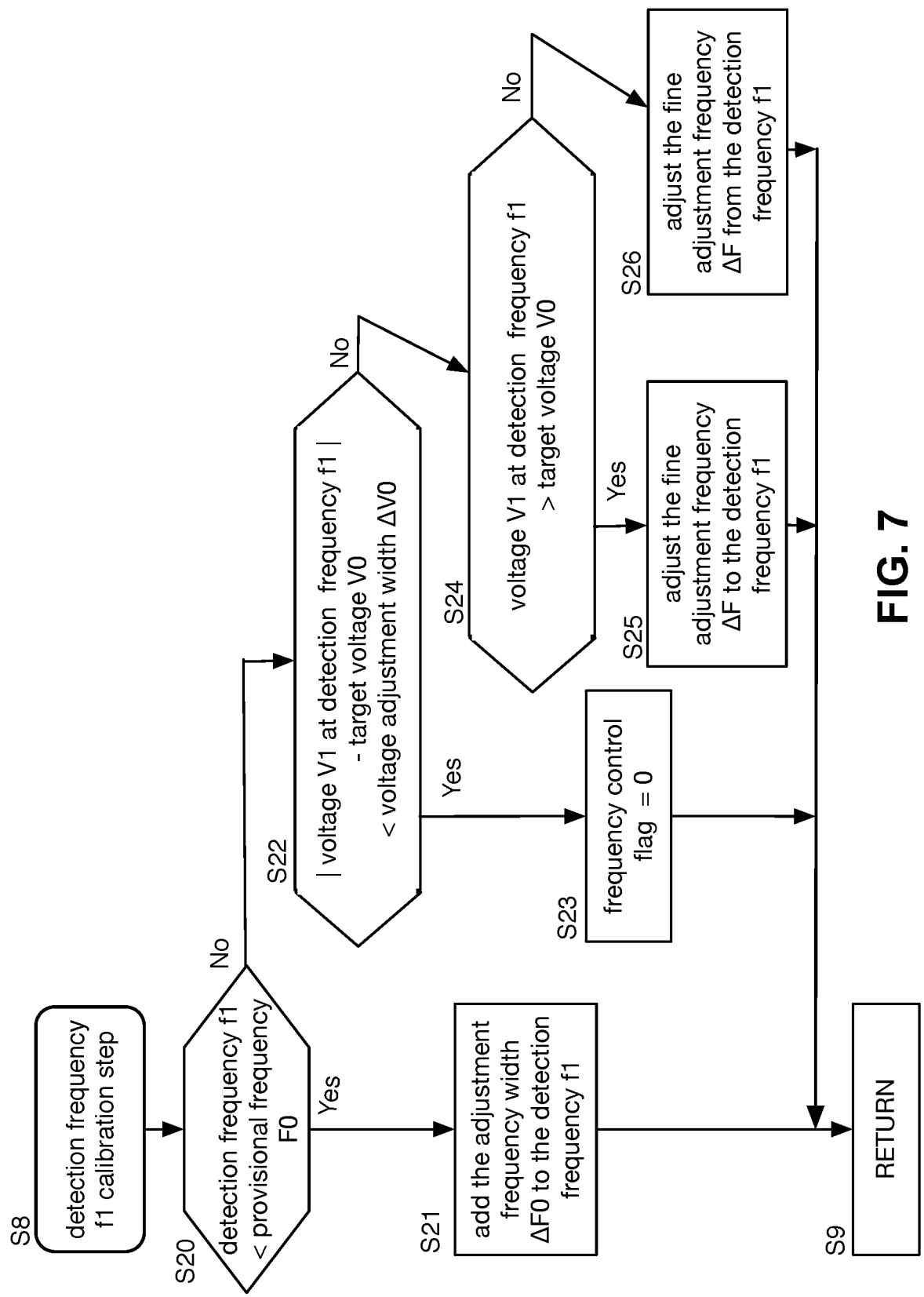
FIG. 7 is a flowchart describing a detection frequency calibration step in a capacitive proximity sensor in one mode of embodiment of the present invention.
Figure 8A:
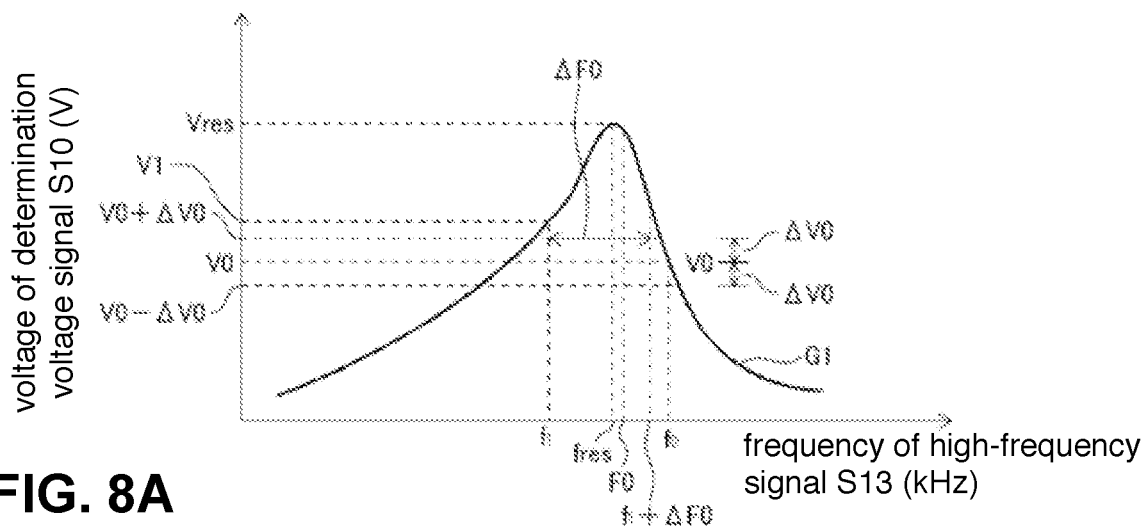
FIG. 8A, FIG. 8B, and FIG. 8C are characteristic graphs describing a detection frequency calibration step in a capacitive proximity sensor in one mode of embodiment of the present invention.
Figure 8B:
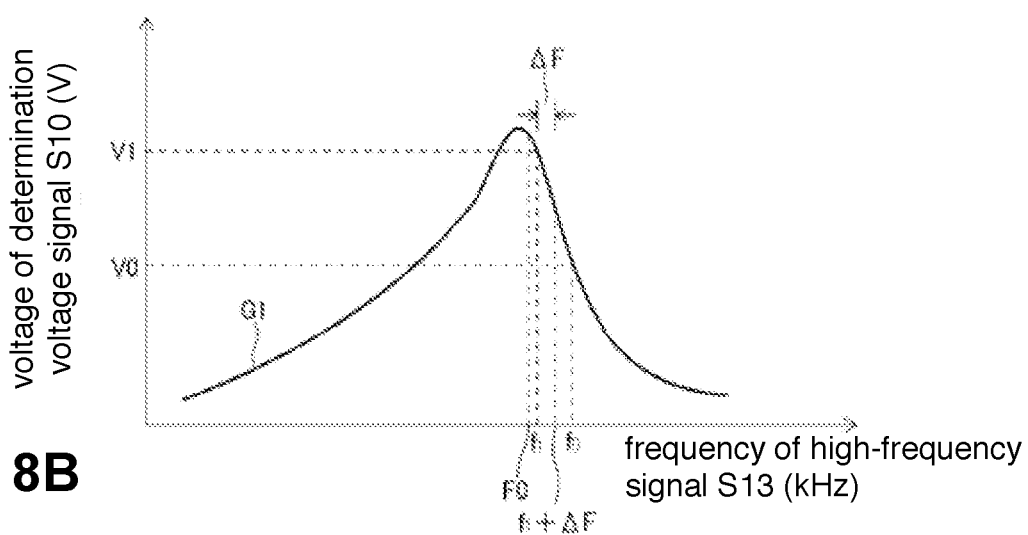
Figure 8C:
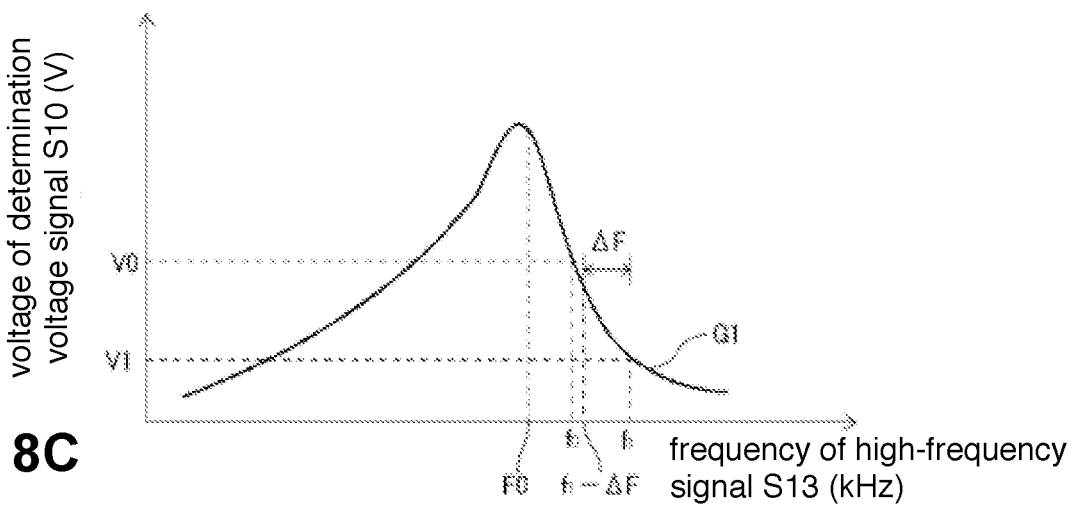
Figure 9:
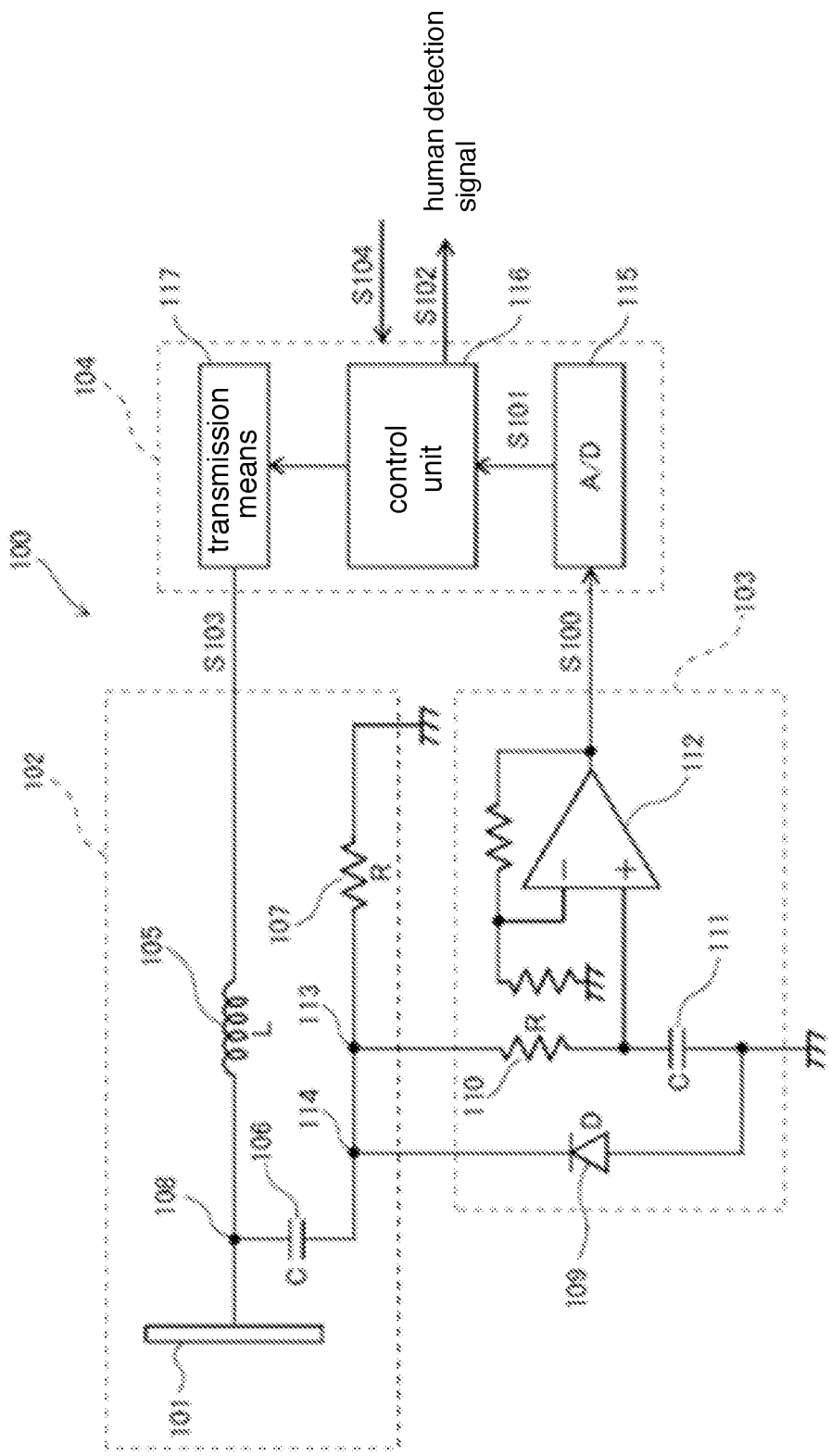
FIG. 9 is a circuit diagram describing a conventional capacitive proximity sensor.

FIG. 6 is a flowchart describing the step control in the proximity sensor 10 of the present mode of embodiment. FIG. 7 is a flowchart describing the detection frequency calibration step in the proximity sensor 10 of the present mode of embodiment. FIG. 8A, FIG. 8B, and FIG. 8C are characteristic graphs describing the detection frequency calibration step in the proximity sensor 10 of the present mode of embodiment. Note that, in describing FIG. 6 to FIG. 8, FIG. 1 FIGS. 8A,B,C, FIGS. 1A,B to FIG. 5 will be referred to as appropriate.

In step S0 shown in FIG. 6, when the user 15 carrying an electronic key approaches the vehicle 12, wireless communication is performed between the electronic key and a electronic key authentication system of the vehicle 12 to authenticate that the electronic key is a legitimate electronic key for the vehicle 12. The proximity sensor 10 is then activated by vehicle 12 as a result of having authenticated that this is a legitimate electronic key. Note that, the authentication of the electronic key employs a known authentication method for smart entry systems.

In step S1, the transmission means 35 of the microcomputer 22 outputs a high-frequency signal S13 at the most recent detection frequency $f_1$ and duty ratio to the sensor circuit 20. Then, the most recent determination voltage signal S10 output from the detection circuit 21 is input to the AD converter 33 of the microcomputer 22, and the AD converter 33 outputs, to the control unit 34, the proximity determination signal S11, resulting from A/D conversion of the determination voltage signal S10 that has been input.

In step S2, the control unit 34 of the microcomputer 22 determines whether or not the absolute value of the calculated result of subtracting a preset target voltage V0 (see FIG. 8A) from the voltage V1 of the proximity determination signal S11 (at most recent detection frequency $f_1$) is greater than a preset allowable voltage difference $\Delta V0$ (see FIG. 8A). Note that, the target voltage V0 and the allowable voltage difference $\Delta V0$ are fixed values that are preset when the proximity sensor 10 is installed in the vehicle 12.

If, with a YES in step S2, the control unit 34 determines that the absolute value is greater than the allowable voltage difference $\Delta V0$, in step S3, the control unit 34 adds 1 to the count. Then, in step S4, the control unit 34 determines whether the count is greater than N or not. Conversely, if, with a NO in step S2, the control unit 34 determines that the absolute value is less than or equal to the allowable voltage difference $\Delta V0$, the count is set to 0 and the process proceeds to step S6.

If, with a YES in step S4, the control unit 34 determines that the count is greater than N, in step S5, the control unit 34 sets the frequency control flag to 1. Conversely, if, with a NO in step S4, the control unit 34 determines that the count is less than or equal to N, we proceed to step S6. Note that a frequency control flag of 1 is a flag for executing the detection frequency calibration step, and a frequency control flag of 0 is a flag for executing the detection step.

In step S6, the control unit 34 determines whether or not a mode flag is 1. Note that, a mode flag of 1 is a flag for executing the detection frequency calibration step, and a mode flag of 0 is a flag for executing the detection step.

If, with a YES in step S6, the control unit 34 determines that the mode flag is 1, then, in step S7, the control unit 34 determines whether or not the frequency control flag is 1.

If, with a YES in step S7, the control unit 34 determines that the frequency control flag is 1, then, in step S8, the control unit 34 performs the detection frequency $f_1$ calibration step. Thereafter, in step S9, the control unit 34 sets the mode flag to 0 and returns to step S1. Note that, the detection frequency $f_1$ calibration step will be described later, using FIG. 7 and FIGS. 8A,B,C.

Meanwhile, if, with a NO in step S6, the control unit 34 determines that the mode flag is 0, or if, with a NO in step S7, the control unit 34 determines that the frequency control flag is 0, in step S10, the control unit 34 executes the detection step. Thereafter, in step S11, the control unit 34 sets the mode flag to 1 and returns to step S1.

In the detection step in the present mode of embodiment, for example, if the foot 16 of the user 15 has moved under the sensor electrode 11 within a predetermined time, as described above using FIG. 5, when the voltage change $\Delta V$ at the detection frequency $f_1$ is equal to or greater than a specified threshold value, the control unit 34 determines that the change in capacitance at the sensor electrode 11 results from the foot 16 of the user 15. Note that the design of the detection method in the detection step can be modified at will.

As described above, a determination is made regarding the mode flag in step S6, and a determination is made regarding the frequency control flag in step S7, in addition to which, the mode flag is set to 0 after the detection frequency $f_1$ calibration step in step S8, and the mode flag is set to 1 after the detection step control in step S11. That is to say, in the present mode of embodiment, the detection frequency $f_1$ can be re-set in keeping with changes in the environment around the vehicle 12 by performing step control in which the detection frequency $f_1$ calibration step and the detection step are alternately executed. As a result, even if the environment around the vehicle 12 changes, the foot 16 of the user 15 can be detected at the most recent detection frequency $f_1$, thereby preventing erroneous detection and missed detection, so as to increase the detection accuracy of the proximity sensor 10.

As shown in FIG. 7, in step S8, the detection frequency $f_1$ is calibrated to re-set the detection frequency $f_1$, which has changed in keeping with changes in the environment around the vehicle 12. In general, when re-setting the detection frequency $f_1$, a method is used with which the most recent resonance frequency is found by sweeping a predetermined frequency range, and then a predetermined frequency is added (or subtracted) to most recent resonance frequency that is found, so as to obtain the most recent detection frequency $f_1$. However, in the present mode of embodiment, a frequency slightly higher than the resonance frequency $f_{res}$ is set as the detection frequency $f_1$, but because the signal change in the vicinity of said frequency is steep, the re-setting method described above cannot be adopted. Therefore, in the present mode of embodiment, a method of fine adjustment the detection frequency $f_1$ is used so as to bring the voltage V1 of the determination voltage signal S10 when a human body is not detected closer to the target voltage V0. Specifically, the detection frequency $f_1$ is re-set by a control flow based on the following step S20 to step S26.

Here, FIG. 8A, FIG. 8B, and FIG. 8C show the relationship between the high-frequency signal S13 input to the sensor circuit 20 and the determination voltage signal S10, showing the characteristic curve G1 for the frequency characteristics when the foot 16 of the user 15 is not in proximity of the sensor electrode 11. The horizontal axis indicates the frequency f (kHz) of the high-frequency signal S13 input from the transmission means 35 of the microcomputer 22 to the sensor circuit 20, and the vertical axis indicates the voltage (V) of the determination voltage signal S10 output from the detection circuit 21.

In step S20, the control unit 34 of the microcomputer 22 determines whether or not the most recent detection frequency $f_1$ is lower than a preset provisional frequency F0.

As shown in FIG. 8A, the provisional frequency F0 is a frequency slightly higher than the resonance frequency $f_{res}$ of the high-frequency signal S13, and is a reference frequency for temporarily setting the detection frequency $f_1$ in a frequency region higher than the resonance frequency $f_{res}$ prior to fine adjustment at the detection frequency $f_1$, and is a fixed value set in advance. The adjustment frequency width ΔF0 is the frequency width that serves to set the detection frequency $f_1$ higher than the provisional frequency F0 in the control flow, and is a fixed value set in advance.

Furthermore, the target voltage V0 is a fixed value set in advance with respect to the voltage $V_{res}$ at the resonance frequency $f_{res}$, and is set to approximately half the value of the voltage $V_{res}$ to ensure the large voltage change ΔV described above in FIG. 5. Furthermore, the voltage adjustment width ΔV0 is the voltage width for setting the allowable range, relative to the target voltage V0, for the determination voltage signal S10 when a human body is not detected, and is a fixed value set in advance.

As described above with reference to FIG. 7, the resonance frequency $f_{res}$ also changes depending on the environment around the vehicle 12 and, therefore, by calibrating the detection frequency $f_1$ so that the determination voltage signal S10 when a human body is not detected is always set within the range of the voltage adjustment width ΔV0 centered on the target voltage V0, it is possible to respond to changes in the surrounding environment and improve the detection accuracy of the proximity sensor 10. Note that the term, fixed value, refers to a value that is set when the proximity sensor 10 is installed in the vehicle 12, and the value may differ depending on the vehicle model.

If, with a YES in step S20, the control unit 34 determines that the detection frequency $f_1$ is lower than the provisional frequency F0, in step S21, the control unit 34 adds the preset adjustment frequency width ΔF0 to the detection frequency and returns to step S9 of the step control shown in FIG. 7. If the adjustment frequency width is still lower than the provisional frequency F0 even after adding the adjustment frequency width ΔF0, the adjustment frequency width ΔF0 is added to the detection frequency $f_1$ again in step S20 in the next iteration.

If, with a NO in step S20, the control unit 34 determines that the detection frequency $f_1$ is higher than the provisional frequency F0, in step S22, the control unit 34 determines whether or not the absolute value of the calculated result of subtracting the preset target voltage V0 from the voltage V1 at the detection frequency $f_1$ is less than the preset voltage adjustment width ΔV0.

If, with a YES in step S22, the control unit 34 determines that the absolute value of the calculation result is less than the voltage adjustment width ΔV0, in step S23, the control unit 34 sets the frequency control flag to 0 and returns to step S9 in the step control shown in FIG. 7.

If, with a NO in step S22, the control unit 34 determines that the absolute value of the calculation result is equal to or greater than the voltage adjustment width ΔV0, in step S24, the control unit 34 determines whether or not the voltage V1 of the determination voltage signal S10 at the detection frequency $f_1$ is greater than the target voltage V0.

If, with a YES in step S24, the control unit 34 determines that the voltage V1 at the detection frequency $f_1$ is greater than the target voltage V0, in step S25, the control unit 34 adds a preset frequency width for fine adjustment ΔF to the detection frequency $f_1$, and returns to step S9 in the step control shown in FIG. 7. If the voltage V1 at the detection frequency $f_1$ still does not fall within the range of the voltage adjustment width ΔV0 centered on the target voltage V0, even after adding the fine adjustment frequency width ΔF, the fine adjustment frequency width ΔF is added to the detection frequency $f_1$ again in step S25 in the next iteration.

Here, in the situation of a YES in step S24, as shown in FIG. 8B, the detection frequency $f_1$ is higher than the provisional frequency F0 and lower than the frequency $f_0$ at the target voltage V0. Therefore, in step S25, by adding the fine adjustment frequency width ΔF to the detection frequency $f_1$ so as to bring the detection frequency $f_1$ closer to the frequency $f_0$ at the target voltage V0, the detection accuracy of the proximity sensor 10 can be improved.

If, with a NO in step S24, the control unit 34 determines that the voltage V1 at the detection frequency $f_1$ is less than or equal to the target voltage V0, in step S26, the control unit 34 subtracts the preset frequency width for fine adjustment ΔF from the detection frequency $f_1$, and returns to step S9 in the step control shown in FIG. 7. If the voltage V1 at the detection frequency $f_1$ still does not fall within the range of the voltage adjustment width ΔV0 centered on the target voltage V0, even after subtracting the fine adjustment frequency width ΔF, the fine adjustment frequency width ΔF is subtracted from the detection frequency $f_1$ again in step S26 in the next iteration.

Here, in the situation of a NO in step S24, as shown in FIG. 8C, the detection frequency $f_1$ is higher than the frequency $f_0$ at the target voltage V0. Therefore, in step S26, by subtracting the fine adjustment frequency width ΔF from the detection frequency $f_1$ so as to bring the detection frequency $f_1$ closer to the frequency $f_0$ at the target voltage V0, the detection accuracy of the proximity sensor 10 can be improved.

Note that, in the present mode of embodiment, a case is described in which the proximity sensor 10 is arranged in the rear bumper 13 or in a step for getting in and out of the vehicle, and detects the foot 16 of the user 15 whereby the back door 14 or a sliding door is opened/closed but, for example, the proximity sensor 10 may be arranged in the movable door panel of the sliding door and used as a trapping sensor that detects the presence of a human body so as to prevent a human body from being trapped by the door. Furthermore, the proximity sensor 10 is not limited to being driven at all times, but rather may be operated intermittently, for example, to reduce power consumption or to distribute radiated noise over time. Various other changes are possible without departing from the gist of the present invention.

What is claimed is:

1. A capacitive proximity sensor, comprising:
   a sensor electrode that detects the proximity of a human body;
   a transmission means for transmitting a high-frequency signal to the sensor electrode;
   a sensor circuit that outputs a detection result based on the capacitance change at the sensor electrode as a detection signal;
   a detection circuit that outputs the detection signal input from the sensor circuit as a determination voltage signal; and
   a control unit that determines the proximity of the human body to the sensor electrode based on the determination voltage signal input from the detection circuit,
   wherein: the sensor circuit has
   an LC parallel circuit in which a coil and a first capacitor are connected in parallel, and
   a second capacitor, the upstream side of which is connected in series with the coil to form an LC series resonant circuit, and the downstream side of which is connected to the downstream side of the first capacitor;
   the sensor electrode is connected to the upstream side of the LC parallel circuit and consists of a single electrode; and
   the detection circuit is connected to the downstream side of the coil and the upstream side of the second capacitor.

2. The capacitive proximity sensor according to claim 1, wherein
   the detection circuit has a rectifier circuit in which a diode and a resistor are connected in parallel, and the frequency characteristics of the detection signal are adjusted with the resistor.

3. The capacitive proximity sensor according to claim 1, wherein
   the capacitance of the first capacitor is adjusted to reduce the radiated noise from the sensor electrode within a desired range and to satisfy a detection sensitivity within a desired range at the sensor electrode.

4. The capacitive proximity sensor according to claim 2, wherein
   the capacitance of the first capacitor is adjusted to reduce the radiated noise from the sensor electrode within a desired range and to satisfy a detection sensitivity within a desired range at the sensor electrode.

5. The capacitive proximity sensor according to claim 1, wherein:
   the control unit has at least a detection frequency calibration step for the high-frequency signal; and
   in the calibration step
   the voltage of the determination voltage signal at the detection frequency when the human body is not in proximity of the sensor electrode is compared with a preset target voltage, and
   if the voltage of the determination voltage signal is beyond a predetermined range having the target voltage as the central value, a predetermined frequency width is added to or subtracted from the detection frequency, so that the voltage of said determination voltage signal is adjusted to be closer to the target voltage.

6. The capacitive proximity sensor according to claim 5, wherein
   the control unit performs step control by alternately repeating the calibration step and the detection step for determining the proximity of the human body.

* * * * *